United States Patent
Uchaykin

(10) Patent No.: US 10,326,071 B2
(45) Date of Patent: Jun. 18, 2019

(54) SYSTEMS AND METHODS FOR MAGNETIC SHIELDING

(71) Applicant: D-Wave Systems Inc., Burnaby (CA)

(72) Inventor: Sergey V. Uchaykin, Burnaby (CA)

(73) Assignee: D-Wave Systems Inc., Vancouver (CA)

( * ) Notice: Subject to any disclaimer, the term of this patent is extended or adjusted under 35 U.S.C. 154(b) by 261 days.

(21) Appl. No.: 15/272,268

(22) Filed: Sep. 21, 2016

(65) Prior Publication Data
US 2017/0077380 A1 Mar. 16, 2017

Related U.S. Application Data

(62) Division of application No. 13/863,962, filed on Apr. 16, 2013, now Pat. No. 9,465,401, which is a division
(Continued)

(51) Int. Cl.
| | |
|---|---|
| *H01L 39/02* | (2006.01) |
| *G06N 99/00* | (2019.01) |
| *H01L 27/18* | (2006.01) |
| *H05K 9/00* | (2006.01) |
| *H01F 13/00* | (2006.01) |
| *H01L 39/04* | (2006.01) |
| *G05F 7/00* | (2006.01) |

(52) U.S. Cl.
CPC .............. *H01L 39/02* (2013.01); *G05F 7/00* (2013.01); *G06N 99/002* (2013.01); *H01F 13/006* (2013.01); *H01L 27/18* (2013.01); *H01L 39/04* (2013.01); *H05K 9/0071* (2013.01)

(58) Field of Classification Search
CPC ......... H01L 39/02; H01L 39/04; H01L 27/18; G05F 7/00; G05F 13/006; G06N 99/02; G06N 99/002; H05K 9/0071
See application file for complete search history.

(56) References Cited

U.S. PATENT DOCUMENTS

| | | | | |
|---|---|---|---|---|
| 3,720,847 A | * | 3/1973 | Massar | .................. H01L 39/20 174/15.4 |
| 4,649,349 A | | 3/1987 | Chiron et al. | |

(Continued)

FOREIGN PATENT DOCUMENTS

| | | |
|---|---|---|
| WO | 2009/099972 A2 | 8/2009 |
| WO | 2010/042735 A2 | 4/2010 |

OTHER PUBLICATIONS

Uchaykin, "System and Methods for Magnetic Shielding," Amendment, filed Feb. 14, 2013, for U.S. Appl. No. 13/050,742, 6 pages.
(Continued)

*Primary Examiner* — Zeev V Kitov
(74) *Attorney, Agent, or Firm* — Cozen O'Connor

(57) ABSTRACT

Systems and methods for magnetic shielding are described. A magnetic shield formed of a material having a high magnetic permeability may be degaussed using a toroidal degaussing coil. The toroidal degaussing coil may enclose at least a portion of the shield. Magnetic field gradients may be actively compensated using multiple magnetic field sensors and local compensation coils. Trapped fluxons may be removed by an application of Lorentz force wherein an electrical current is passed through a superconducting plane.

18 Claims, 6 Drawing Sheets

Related U.S. Application Data of application No. 13/050,742, filed on Mar. 17, 2011, now Pat. No. 8,441,330.

(60) Provisional application No. 61/316,744, filed on Mar. 23, 2010.

(56) References Cited

U.S. PATENT DOCUMENTS

| | | | |
|---|---|---|---|
| 4,963,789 A | 10/1990 | Buhler | |
| 5,066,891 A | 11/1991 | Harrold et al. | |
| 5,280,241 A | 1/1994 | Ueda et al. | |
| 5,969,933 A | 10/1999 | Schultz et al. | |
| 6,331,805 B1 * | 12/2001 | Gupta | H03B 15/00 327/528 |
| 6,831,281 B2 | 12/2004 | Nakasuji | |
| 7,687,938 B2 | 3/2010 | Bunyk et al. | |
| 7,990,662 B2 | 8/2011 | Berkley et al. | |
| 8,247,799 B2 | 8/2012 | Bunyk et al. | |
| 2002/0180006 A1 * | 12/2002 | Franz | B82Y 10/00 257/661 |
| 2007/0052304 A1 * | 3/2007 | Masson | H02K 19/00 310/52 |
| 2009/0008632 A1 | 1/2009 | Bunyk et al. | |
| 2011/0130293 A1 * | 6/2011 | Kawashima | H01F 6/04 505/163 |
| 2011/0237442 A1 | 9/2011 | Uchaykin | |

OTHER PUBLICATIONS

Notice of Allowance, dated Mar. 14, 2013, for U.S. Appl. No. 13/050,742, Uchaykin, "System and Methods for Magnetic Shielding," 7 pages.

Office Action, dated Dec. 27, 2012, for U.S. Appl. No. 13/050,742, Uchaykin, "System and Methods for Magnetic Shielding," 7 pages.

* cited by examiner

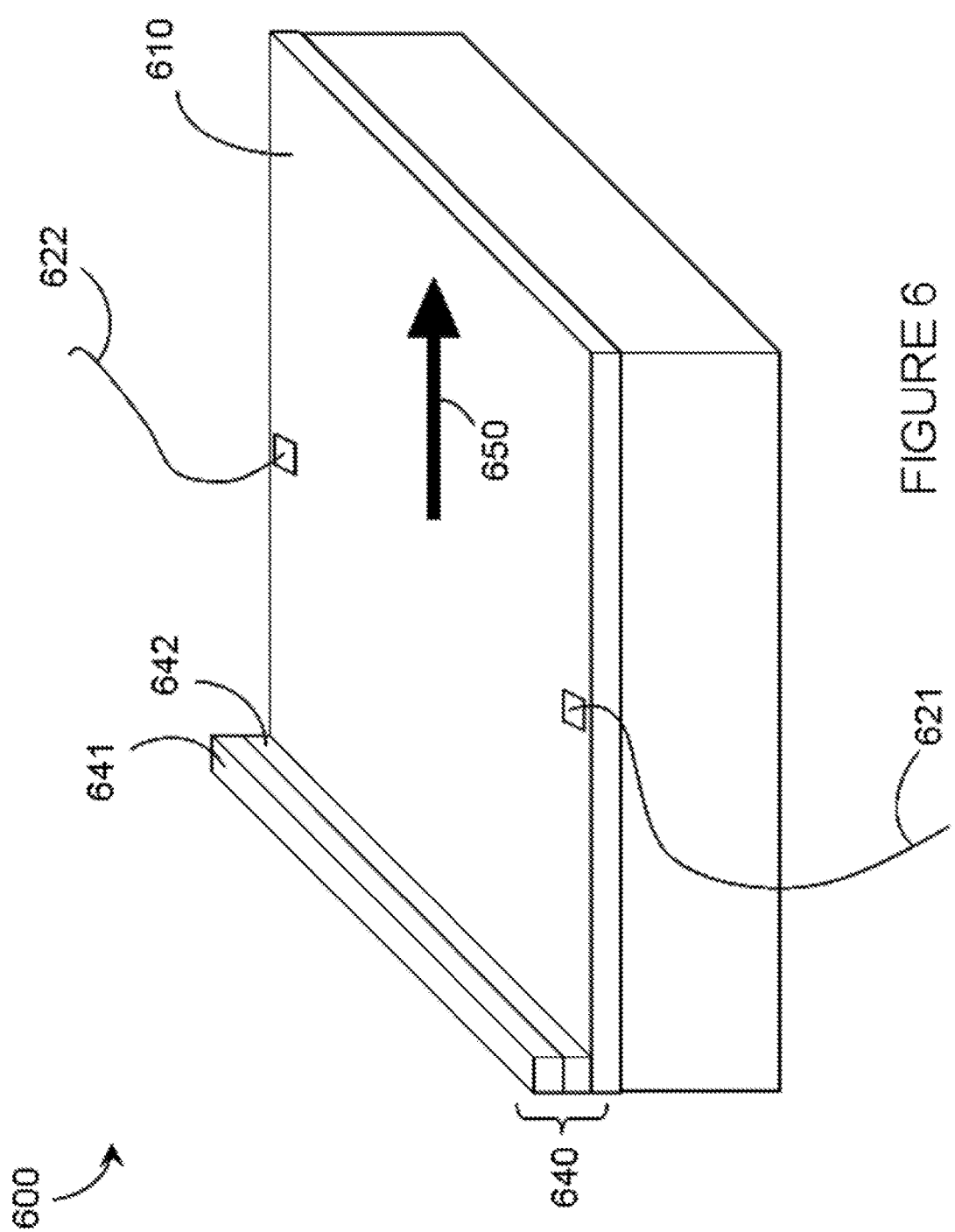

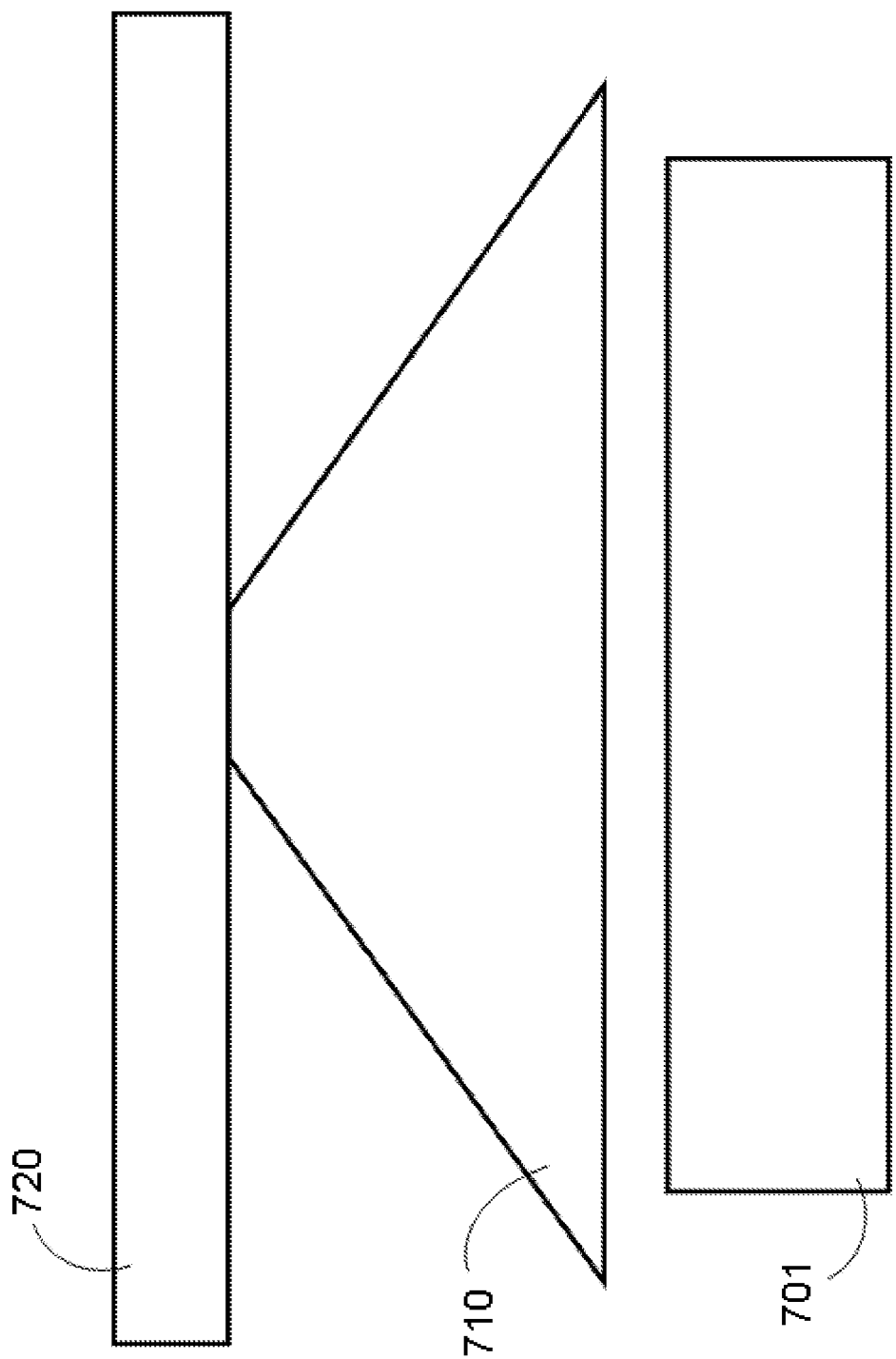

SYSTEMS AND METHODS FOR MAGNETIC SHIELDING

BACKGROUND

Field

The present systems and methods generally relate to magnetic shielding and particularly relate to providing an environment with low magnetic fields and/or low magnetic field gradients.

Refrigeration

According to the present state of the art, a superconducting material may generally only act as a superconductor if it is cooled below a critical temperature that is characteristic of the specific material in question. For this reason, those of skill in the art will appreciate that an electrical system that implements superconducting components may implicitly include a refrigeration system for cooling the superconducting materials in the system. Systems and methods for such refrigeration systems are well known in the art. A dilution refrigerator is an example of a refrigeration system that is commonly implemented for cooling a superconducting material to a temperature at which it may act as a superconductor. In common practice, the cooling process in a dilution refrigerator may use a mixture of at least two isotopes of helium (such as helium-3 and helium-4). Full details on the operation of typical dilution refrigerators may be found in F. Pobell, *Matter and Methods at Low Temperatures*, Springer-Verlag Second Edition, 1996, pp. 120-156. However, those of skill in the art will appreciate that the present systems and devices are not limited to applications involving dilution refrigerators, but rather may be applied using any type of refrigeration system.

BRIEF SUMMARY

A magnetic shielding system may be summarized as including a shield structure having a longitudinal center axis; and a degaussing coil, wherein the degaussing coil is wrapped around at least a portion of the shield structure in a toroidal configuration such that the degaussing coil encloses at least a portion of the shield structure and at least a portion of the degaussing coil is parallel to the longitudinal center axis of the shield structure. The shield structure may be formed of a material having high magnetic permeability selected from the group consisting of Finemet® (available from Hitachi Metals, Ltd.), mu-metal, and cryoperm. The shield structure may be tubular and/or cylindrical in geometry. The shield structure may have a closed end, and the closed end may include a through-hole through which the degaussing coil is threaded. A cap may be position over the through-hole. In some embodiments, the magnetic shielding system may include a current source, wherein the degaussing coil is electrically coupled to the current source.

A system for compensating for a magnetic field gradient across an area may be summarized as including at least two magnetic field sensors respectively positioned at opposite ends of the area; at least two compensation coils respectively positioned proximate opposite ends of the area; and at least a first current source. The at least two compensation coils may be electrically coupled in series with one another and both coupled to the same current source. Alternatively, the system may include a second current source, wherein a first compensation coil is electrically coupled to the first current source and a second compensation coil is electrically coupled to the second current source. The at least two compensation coils may be respectively positioned proximate opposite ends along a width of the area, and the system may include at least two additional compensation coils that are respectively positioned proximate opposite ends along a length of the area. At least two magnetic field sensors may be respectively positioned at opposite ends along the width of the area, and the system may include at least two additional magnetic field sensors that are respectively positioned at opposite ends along the length of the area.

A superconducting chip may be summarized as including a plurality of superconducting devices; a superconducting plane positioned beneath the plurality of superconducting devices; a first current lead electrically coupled to the superconducting plane; and a second current lead electrically coupled to the superconducting plane. The superconducting chip may include a fluxon barrier carried on the superconducting plane, wherein the fluxon barrier is positioned adjacent to an edge of the superconducting plane and extends substantially parallel thereto, and wherein the fluxon barrier includes at least a first strip of superconducting material. The fluxon barrier may include at least a second strip of superconducting material that is stacked on top of the first strip of superconducting material.

BRIEF DESCRIPTION OF THE SEVERAL VIEWS OF THE DRAWING(S)

In the drawings, identical reference numbers identify similar elements or acts. The sizes and relative positions of elements in the drawings are not necessarily drawn to scale. For example, the shapes of various elements and angles are not drawn to scale, and some of these elements are arbitrarily enlarged and positioned to improve drawing legibility. Further, the particular shapes of the elements as drawn are not intended to convey any information regarding the actual shape of the particular elements, and have been solely selected for ease of recognition in the drawings.

FIG. 6 is a perspective view showing an embodiment of a superconducting chip (e.g., a superconducting quantum processor chip) including a superconducting plane used to remove trapped fluxons from the chip.

FIG. 7 is a side elevational view of an embodiment of a superconducting processor chip and a pyramidal superconducting shield in accordance with the present systems and methods.

DETAILED DESCRIPTION

Figure 2:
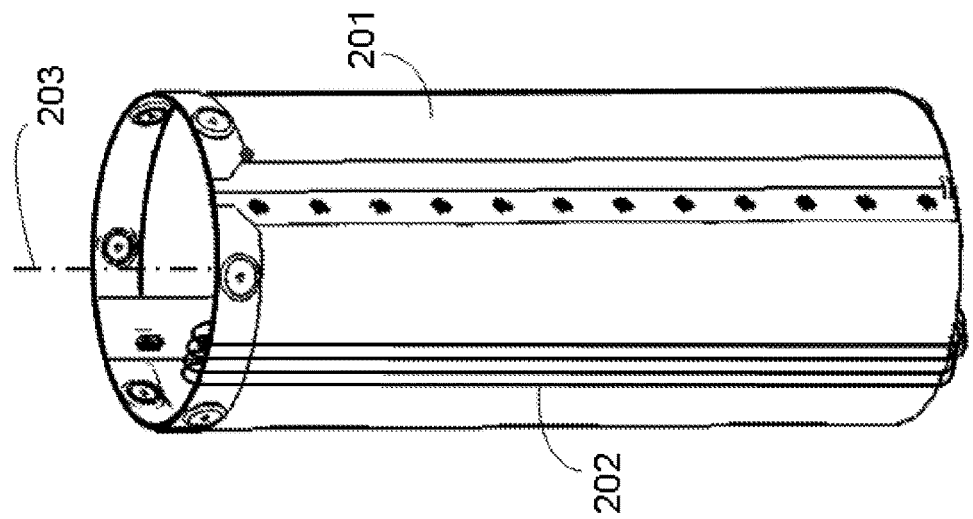
FIG. 2 is a perspective view of a mu-metal shield employing a toroidal degaussing coil in accordance with an embodiment of the present systems and methods.

In the following description, some specific details are included to provide a thorough understanding of various disclosed embodiments. One skilled in the relevant art, however, will recognize that embodiments may be practiced without one or more of these specific details, or with other methods, components, materials, etc. In other instances, well-known structures associated with electronics systems, such as power supplies, signal generators, and control systems including microprocessors and drive circuitry have not been shown or described in detail to avoid unnecessarily obscuring descriptions of the embodiments of the present systems and methods.

Unless the context requires otherwise, throughout the specification and claims which follow, the word "comprise" and variations thereof, such as, "comprises" and "comprising" are to be construed in an open, inclusive sense, that is as "including, but not limited to."

Reference throughout this specification to "one embodiment," or "an embodiment," or "another embodiment" means that a particular referent feature, structure, or characteristic described in connection with the embodiment is included in at least one embodiment. Thus, the appearances of the phrases "in one embodiment," or "in an embodiment," or "another embodiment" in various places throughout this specification are not necessarily all referring to the same embodiment. Furthermore, the particular features, structures, or characteristics may be combined in any suitable manner in one or more embodiments.

It should be noted that, as used in this specification and the appended claims, the singular forms "a," "an," and "the" include plural referents unless the content clearly dictates otherwise. Thus, for example, reference to a shielding system including "a magnetic shield" includes a single magnetic shield, or two or more magnetic shields. It should also be noted that the term "or" is generally employed in its sense including "and/or" unless the content clearly dictates otherwise.

The headings provided herein are for convenience only and do not interpret the scope or meaning of the embodiments.

The various embodiments described herein provide systems and methods for achieving low magnetic fields and/or low magnetic field gradients over a particular area or volume. The present systems and methods include both passive and active techniques for reducing magnetic fields and/or magnetic field gradients in an environment.

An established passive technique for reducing magnetic fields within an environment is to enclose the environment with a shield formed of a material having high magnetic permeability. Such shields are typically cylindrical in geometry with at least one open end providing access to the enclosed volume. Exemplary materials that are appropriate for this purpose include Finemet®, Mumetal® and Cryoperm®. Both Mumetal® and Cryoperm® are nickel-alloys of high magnetic permeability (e.g., with a maximum permeability typically in the range of 100,000 to 500,000) and are known in the art. Thus, throughout this specification, any reference to a "Mumetal®" shield may be considered to also include embodiments that implement Cryoperm® shields, or shields made of any other material of high magnetic permeability. For the purposes of the present systems and methods, the term "high magnetic permeability" is used to describe a material with a maximum magnetic permeability on the order of 100,000 or more. Cylindrical Mumetal® shields having a specially-designed longitudinal mating seam are described in PCT Patent Publication 2009-099972.

The performance of a magnetic shield, such as a passive Mumetal® shield, may be significantly enhanced by degaussing. Degaussing is a process by which a residual magnetism within a material is reduced, or "wiped." The material forming a magnetic shield (e.g., a Mumetal® shield) typically exhibits some residual magnetism which can be reduced by, for example, wrapping a coil of conductive wire around the shield and applying a periodic waveform of gradually decreasing amplitude through the coil. Procedures for degaussing magnetic shields are well known in the art; however, the present systems and methods describe improvements to established degaussing techniques.

Figure 1:
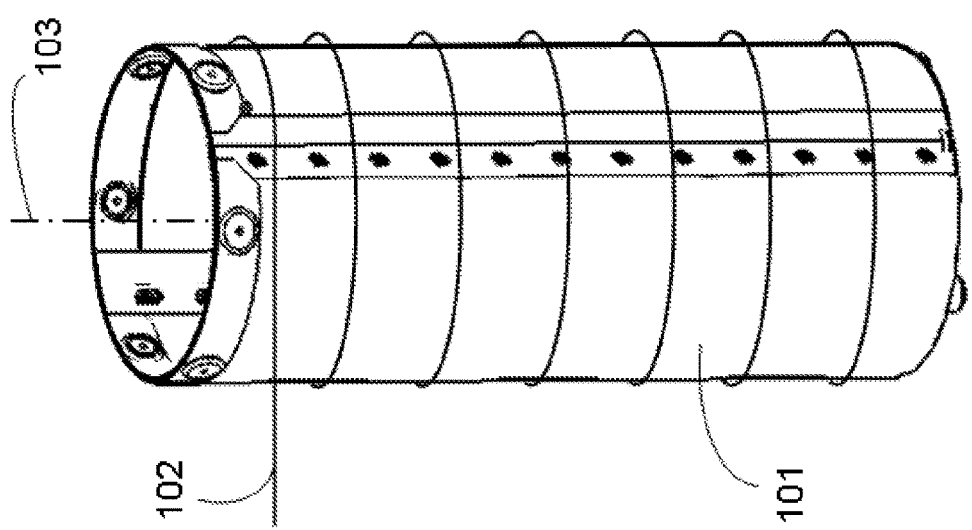
FIG. 1 is a perspective view of mu-metal shield employing a prior art form of degaussing coil.

A typical degaussing coil is carried on or near the surface of a magnetic shield and coiled around or about the longitudinal center axis of the shield in a solenoid-like fashion. FIG. 1 is a perspective view of a shield 101 employing a prior art form of degaussing coil 102. In accordance with the prior art, degaussing coil 102 resembles a solenoid that is carried on the outer surface of shield 101 and coiled around or about (e.g., substantially perpendicular to) the longitudinal center axis 103. That is, a cross-section of the magnetic shield taken perpendicular to the central longitudinal axis is within a volume defined by a projected perimeter of the degaussing coil. This approach can undesirably result in a non-uniform distribution of the degaussing field over the shield volume, particularly at an end (e.g., the base) of the cylindrical shield. The present systems and methods provide an improved geometry of degaussing coils of particular benefit in applications involving a cylindrical magnetic shield. This improved geometry implements degaussing coils in a toroidal arrangement with respect to the shield body.

FIG. 2 shows a perspective view of a shield 201 employing a toroidal degaussing coil 202 in accordance with an embodiment of the present systems and methods. Shield 201 may be formed of any material having a magnetic permeability, such as Mumetal® or Cryoperm®. Toroidal degaussing coil 202 is coiled lengthwise around the surface of shield 201 with the majority of the length of the coil being substantially parallel to the longitudinal center axis 203 of the shield 201. That is, only a portion of the cross-section of the magnetic shield taken perpendicular to the central longitudinal axis is within a volume defined by a projected perimeter of the degaussing coil, while another portion is not within the volume. This toroidal arrangement provides improved degaussing field uniformity over the volume of the shield 201 compared to the solenoidal arrangement of the prior art, especially at an end (e.g., the base) of the cylindrical shield 201. Furthermore, in the toroidal arrangement of FIG. 2 the curved shield body 201 is better aligned with the degaussing field lines produced by the coil 202, the result being that the degaussing fields are better concentrated within the shield 201. Those of skill in the art will appreciate that a toroidal degaussing coil may be implemented in conjunction with other shapes and configurations of shield structures and are not limited to use with cylindrical shields or, in particular, cylindrical shields employing longitudinal mating seams as illustrated.

Toroidal degaussing coil 202 is shown in FIG. 2 as being wrapped around only a small portion of the total body of shield 201. In most applications, toroidal degaussing coil 202 is only required to enclose a small portion of the total shield body 201, and for this reason the toroidal coil geometry of FIG. 2 is lower in mass, easier to produce, and generally less expensive than the solenoidal coil geometry employed in the prior art (e.g., FIG. 1). However, those of skill in the art will appreciate that, in alternative embodiments, the number of turns in coil 202 (and/or the spacing between turns) may be increased or decreased such that coil 202 encloses a greater or lesser portion of the total body of shield 201. In order for degaussing coil 202 to employ a toroidal geometry, it may be necessary to insert a through-hole in the base of shield 201.

Figure 3:
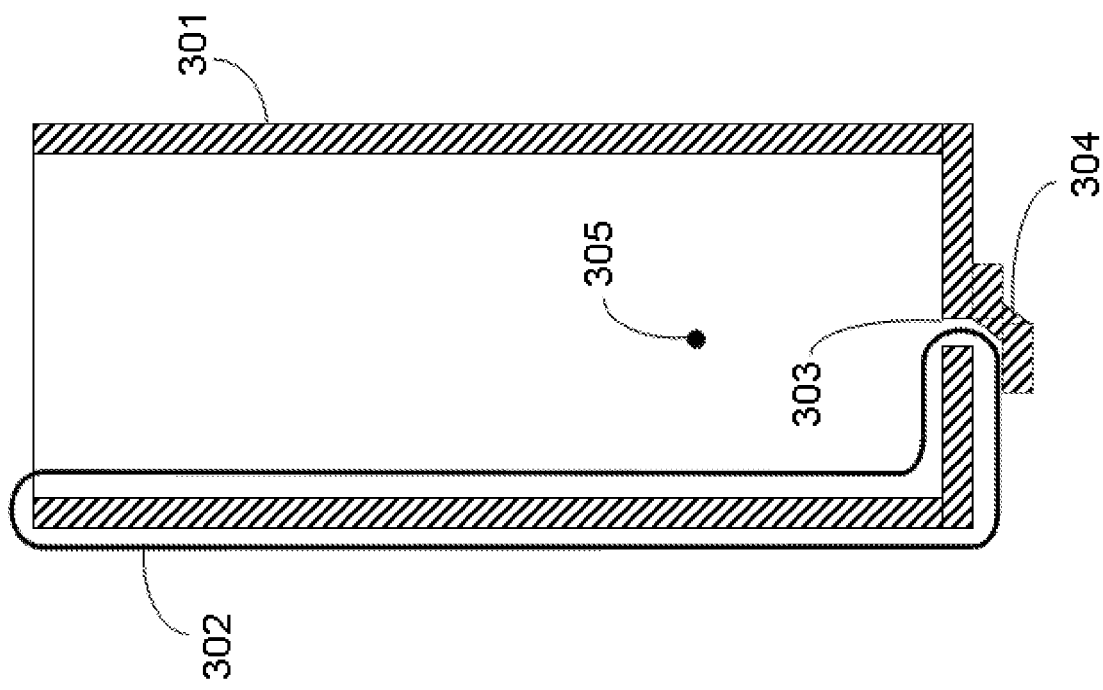
FIG. 3 is a sectional view of a cylindrical magnetic shield employing a toroidal degaussing coil in accordance with an embodiment of the present systems and methods.

FIG. 3 is a sectional view of a cylindrical magnetic shield 301 employing a toroidal degaussing coil 302 in accordance with an embodiment of the present systems and methods. To facilitate the toroidal geometry of coil 302, shield 301 includes a through-hole 303 in its base. Coil 302 is wrapped substantially lengthwise around the body of shield 301 and passes through through-hole 303. Shield 301 also includes a cap 304 formed of a material having high magnetic permeability, such as Mumetal®, Cyroperm®, or Finemet® which covers through-hole 303 to reduce degradation of the shielding characteristics of shield 301 caused by through-hole 303. Cap 304 substantially covers through-hole 303 to reduce (or, preferably, eliminate) the passage of magnetic fields therethrough. Though not shown in the Figure, degaussing coil 302 is communicably coupled to a current source for controlling the degaussing field(s). In some embodiments, the current source may be part of a feedback system that further includes a magnetic field sensor positioned within the volume enclosed by shield 301 (e.g., at position 305). As previously described, the degaussing signal applied by the current source may be periodic (e.g., sinusoidal). The amplitude of the degaussing signal may produce a field that initially exceeds the saturation field for the shield 301 and gradually decreases over time. Some embodiments of shielding systems may employ at least two shields, with a first "inner" shield nested within a second "outer" shield. In such embodiments, each shield may employ a respective toroidal degaussing coil, but the coils may be electrically coupled in series with one another. It may be advantageous for the coil on the outer shield to mediate the coupling between the current source and the coil on the inner shield such that the outer shield is effectively degaussed before the inner shield. In some embodiments, at least one shield may be used to shield a superconducting device, such as a superconducting quantum processor chip, and the shield may be operated at a cryogenic temperature. In such embodiments, it may be advantageous to complete the degaussing process at a cold temperature to avoid changes in the shield magnetization with temperature. For example, it may be advantageous to complete the degaussing process at the coldest possible temperature that is above the critical temperature of the superconducting device being shielded, and then to proceed with cooling the superconducting device after the shield has been degaussed.

In accordance with the present systems and methods, in some embodiments the effective permeability of a magnetic shield may be increased by applying a signal (e.g., a high frequency signal) through the degaussing coils after the degaussing process has been completed. This effect can be achieved because the actual permeability of the degaussed shield may be non-linear in the operating region and the applied signal may effectuate an average permeability that is higher than the permeability realized when no such signal is applied.

The challenge of providing a low-magnetic field environment has received a lot of attention. However, much of this attention is focused on achieving a specific field level (e.g., on the order of nanoTeslas) at a specific measurement point. Comparatively little attention is devoted to providing a substantially uniform low-field environment over an appreciable area, which requires that not only field levels but also field gradients be controlled. The various embodiments described herein provide systems and methods for actively compensating for and thereby reducing magnetic field gradients.

Figure 4:
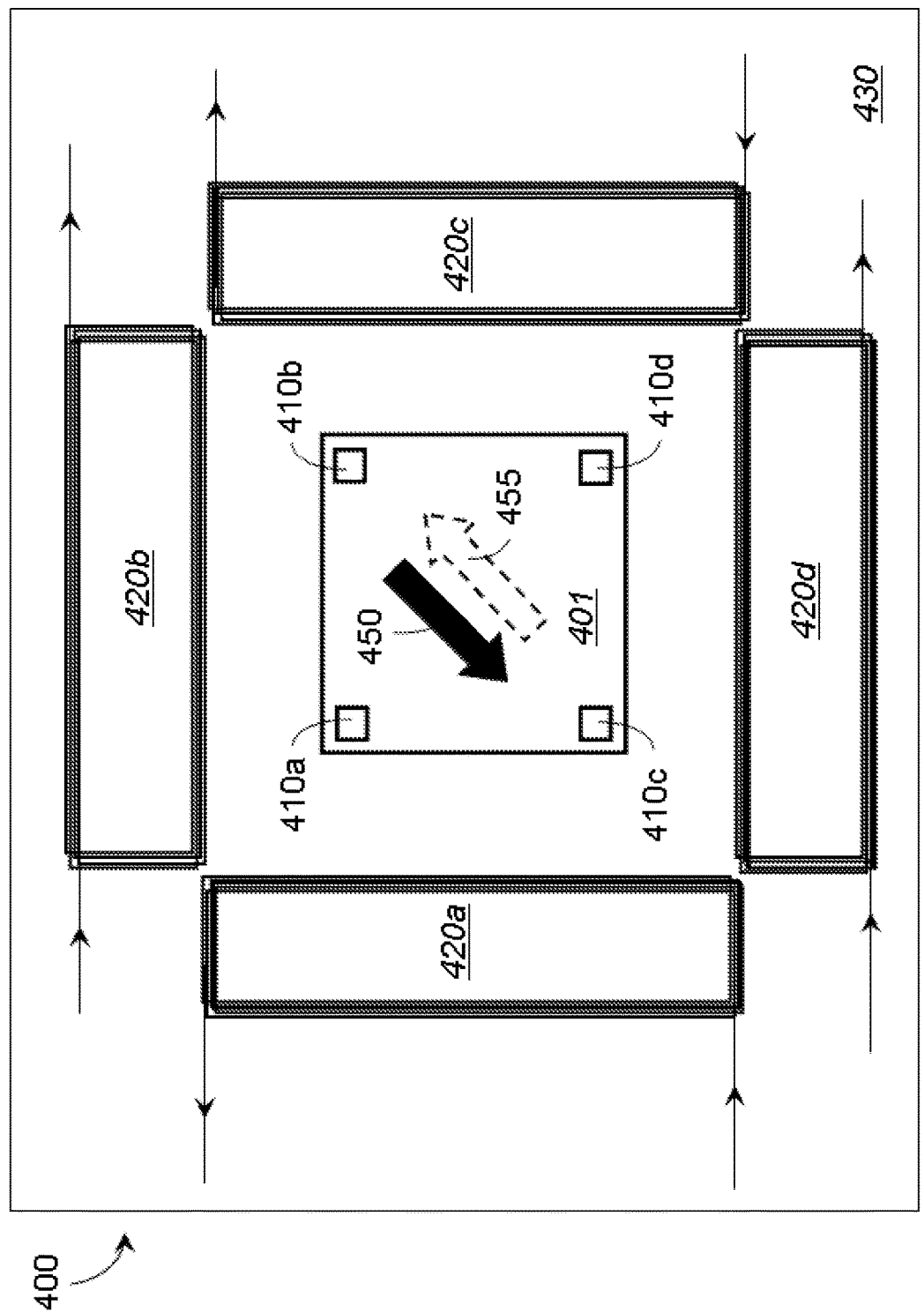
FIG. 4 is a top plan view of an embodiment of a system designed to actively compensate for magnetic field gradients within the environment of a device.

FIG. 4 is a top plan view of an embodiment of a system 400 designed to actively compensate for magnetic field gradients within the environment of a device 401. In some embodiments, device 401 may include a superconducting device, such as a superconducting quantum processor chip. In the illustrated embodiment, device 401 is a chip that includes a plurality of on-chip magnetometers 410a-410d, each of which provides a measure of the magnetic field(s) impingent thereon. In some embodiments, on-chip magnetometers 410a-410d may include the magnetometers described in PCT Patent Application Serial No. PCT/US 2009/060026, now published as PCT Publication 2010/042735, or variations thereof. Each of magnetometers 410a-410d provides a measure of the magnetic field(s) in the vicinity of chip 401. A discrepancy between the readings of any or all of magnetometers 410a-410d can indicate a non-uniformity in the magnetic field(s) around chip 401, which may manifest itself in the form of at least one magnetic field gradient. System 400 includes a set of four gradient compensation coils 420a-420d that are designed to reduce magnetic field gradients over the area of chip 401. Each of gradient compensation coils 420a-420d is formed of conductive wire (e.g., in some embodiments, superconductive wire) and is connected to an electrical current source. In some embodiments, each of gradient compensation coils 420a-420d is connected to a respective independently controlled current source. In other embodiments, at least two of gradient compensation coils 420a-420d are connected in series with one another and both connected to the same current source. For example, gradient compensation coils 420a and 420c may be coupled in series with one another and both controlled by a first current source and gradient compensation coils 420b and 420d may be coupled in series with one another and both controlled by a second current source.

As an exemplary operation, take the scenario where magnetometers 410a, 410b, and 410d all measure approximately the same magnetic field but magnetometer 410c measures a higher magnetic field than the others. This implies a magnetic field gradient over chip 401 in the direction (from lower field to higher field) indicated by arrow 450. This field gradient may be compensated by using coils 420a-420d to generate a compensation field gradient 455 that is approximately opposite to gradient 450. In some embodiments, coils 420a-420d may be used strictly for gradient compensation to produce a uniform field over chip 401 with little added attention to the magnitude of the uniform field. In other embodiments, coils 420a-420d may be simultaneously used to provide both gradient compensation and field compensation, such that a uniform field of a desired level is achieved over the area of chip 401. In the latter case, it may be advantageous to retain individual control of the currents passed through each of coils 420a-420d (i.e., the coils 420a-420d may preferably be electrically isolated from one another).

In the illustrated embodiment, chip 401 and coils 420a-420d are all carried on the same base 430. In some embodiments, base 430 may include a printed circuit board ("PCB") and coils 420a-420d may be realized by conductive (e.g., in some embodiments, superconductive) traces carried on the PCB 430. In other embodiments, coils 420a-430d may be formed by wound wiring that is carried by PCB 430.

The coiling direction of coils 420a-420d may depend on, among other things, the electrical configuration of the coils. In applications employing at least two serially connected coils, their relative coiling directions are important in determining the sort of compensation that can be provided. For example, two serially-connected coils may be better equipped to provide gradient compensation if they are respectively coiled in such a way that, for any given applied signal, one coil produces a positive field on chip 401 and the other coil produces a negative field on chip 401 (e.g., their respective fields are in opposite direction or in anti-parallel arrangement). In the illustrated embodiment, if coils 420a and 420c are electrically coupled in series with one another, then a signal applied in the direction shown by the arrows will enable coil 420a to induce a compensation field in the direction into the page at the chip 401 and coil 420c to induce a compensation field in the direction out of the page at the chip 401, thereby forming a compensation gradient across chip 401. However, relative coiling direction is less significant in embodiments where each of coils 420a-420d is independently controlled and electrically isolated from the others.

The size and shape of coils 420a-420d relative to chip 401 may depend on, among things, the range of field/gradient compensation expected from the coils. In some embodiments, it may be advantageous for coils 420a-420d to be smaller than chip 401 and/or quite close to chip 401 to enable very fine adjustments to the fields and/or gradients. In other embodiments, it may be advantageous for coils 420a-420d to be larger (e.g., longer and/or wider) than chip 401 and/or spaced quite far away from chip 401 so that the chip effectively "sees" a substantially uniform field from each of the coils.

Figure 5:
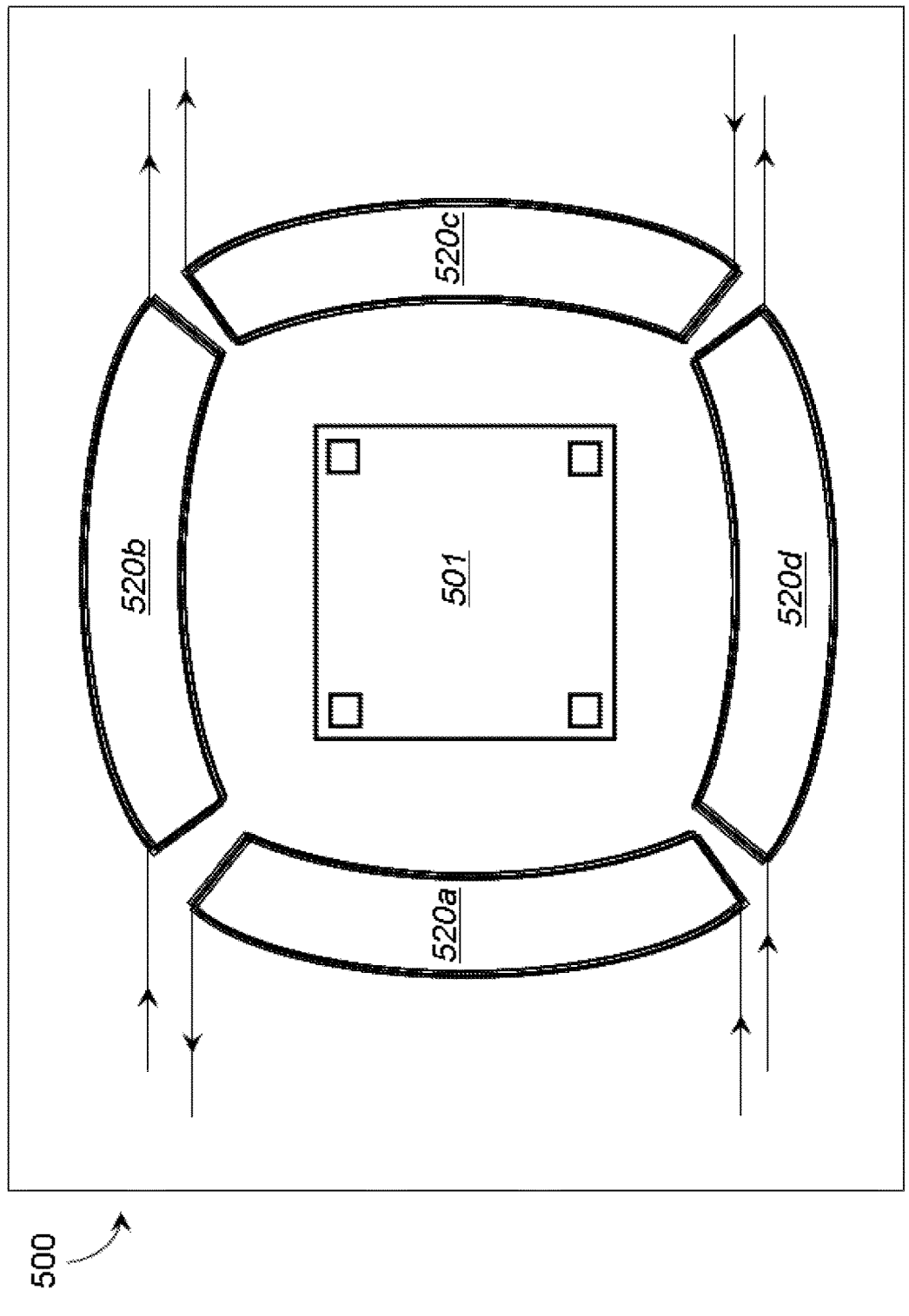
FIG. 5 is a top plan view of an embodiment of a system implementing curved compensation coils designed to actively compensate for magnetic field gradients within the environment of a device.

Realistically, a compensation field produced by any of coils 420a-420d may not be perfectly uniform over chip 401 due to the geometry of the coil itself. For example, coils 420a-420d may produce compensation fields and/or gradients that have non-uniformities near the ends of the coils. In some embodiments, this effect can be made less severe by implementing coils that are curved in shape. FIG. 5 is a top plan view of an embodiment of a system 500 implementing curved compensation coils 520a-520d designed to actively compensate for magnetic field gradients within the environment of a device 501. In some embodiments, the curvature in each of coils 520a-520d can help to produce more uniform compensation fields and/or gradients compared to the right-angled coil geometry illustrated in FIG. 4.

Despite the implementation of passive magnetic shielding and/or active compensation systems, it can be extremely difficult to reduce magnetic fields below a certain point. In applications where extremely low fields (e.g., on the order of nanoTeslas or less) are desired, such as in a system employing a superconducting quantum processor chip, it can be advantageous to introduce a mechanism for dealing with unwanted magnetic fields that cannot be completely shielded or compensated. In the case of a superconducting quantum processor chip, unwanted magnetic fields may manifest themselves as unwanted magnetic flux (i.e., "fluxons") trapped within at least some of the superconducting devices on the chip. In U.S. Pat. No. 7,687,938, an on-chip superconducting plane is used to passively shield on-chip devices from unwanted magnetic fields originating from either on or off the chip. In accordance with the present systems and methods, a similar superconducting plane (or, in some embodiments, the same plane) may be used to actively remove trapped fluxons from the chip by an application of the Lorentz force.

FIG. 6 is a perspective view showing an embodiment of a superconducting chip (e.g., a superconducting quantum processor chip) 600 including a superconducting plane 610 used to remove trapped fluxons from the chip 600. In some embodiments, superconducting plane 610 may also serve as a superconducting ground plane. In accordance with the present systems and methods, fluxons that are trapped in the devices of chip 600 (e.g., fluxons that are trapped in superconducting plane 610) may be expelled from the system by applying a current through plane 610. To this end, current leads 621 and 622 are electrically coupled to superconducting plane 610. Lorentz's Law dictates that a current travelling from lead 622 to lead 621 will experience a Lorentz force causing the current to move in the direction indicated by the arrow 650. Thus, fluxons that are trapped in plane 610 may be expelled through one side (e.g., through the right side in FIG. 6) of the chip 600.

In operation, it is necessary to cool chip 600 below the critical temperature of plane 610 such that plane 610 becomes superconducting. It is the transition to the superconducting regime that can cause plane 610 to trap unwanted fluxons. In order to expel the fluxons by the Lorentz force, the current applied through leads 621 and 622 must exceed the critical current of the plane 610 such that the plane temporarily ceases to superconduct while the current is applied. The magnitude of this critical current is dependent, at least in part, on the temperature of plane 610. It can be desirable to limit the magnitude of the current that may be applied to the superconducting plane 610 in order to accommodate constraints of other aspects of the system. For a conservative current range (e.g., <1.0 A) the temperature range for which Lorentz force may be induced in the superconducting plane 610 may be fairly narrow. In applications where the temperature of the system cannot be precisely controlled, a preferred way to implement the "Lorentz force expulsion" described herein is to apply a current through the plane 610 during cool down of the chip 600. In this way, the plane 610 will pass through the desired temperature range while the fluxon-expulsion current is being applied.

As fluxons are expelled through the right side of plane 610, it is possible for roughly the same number of fluxons to enter from the left side of plane 610. In order to prevent such fluxons from entering the left side of plane 610, a fluxon barrier 640 may be constructed. In some embodiments, such a barrier 640 may comprise a stack of superconducting strips 641, 642 on one side (e.g., on the left side in the illustrated embodiment) of the plane 610. Since there is no current passing through the strips 641, 642, the strips 641, 642 may remain superconducting while the current flowing through plane 610 causes plane 610 to go normal and induce the Lorentz force. With barrier 640 remaining in a superconducting state, fluxons are naturally prevented from penetrating barrier 640. In various embodiments, barrier 640 may include any number of strips of superconducting material. In some embodiments, barrier 640 may be formed of a material that has a higher critical temperature than plane 610.

In some embodiments, it may be advantageous for superconducting plane 610 to be formed of a material that has a higher critical temperature than the rest of chip 600. In some embodiments, it may be advantageous to connect current leads 621 and 622 to diagonally opposite corners of plane 610. If chip 600 includes a superconducting ground plane and/or a superconducting shielding plane, such a plane may be adapted for the removal of fluxons as described herein by adding current leads 621 and 622 and barrier 640. However, in some embodiments, a plane 610 may be added to the existing structure of chip 600 for use in the removal of trapped fluxons even if chip 600 already includes a superconducting shield/ground plane. In some embodiments, plane 610 may be physically separate from chip 600.

In accordance with the present systems and methods, trapped fluxons may be moved by using an applied current to induce a Lorentz force. In addition to this, trapped fluxons may also be moved by introducing a preferential flux gradient and/or a temperature gradient. In some embodiments, a conical or pyramidal superconducting shield may be constructed on or adjacent to a superconducting chip (e.g., a superconducting quantum processor chip) as shown in FIG. 7. FIG. 7 is a side elevational view of an embodiment of a superconducting processor chip 701 and a pyramidal superconducting shield 710. Shield 710 is thermalized by a crossbeam 720 (which is elsewhere thermally coupled to a cold source—not shown) that makes physical contact with its apex. As the system is cooled, it is the apex of shield 710 that becomes superconducting first and the superconductivity then spreads down the sides and to the base of shield 710. This transition pattern creates a preferential gradient for magnetic flux towards the outer edges of the base of shield 710. Thus, the cooling of shield 710 naturally expels flux away from the center of chip 701 and out towards its perimeter (and beyond if the base of shield 710 is made wider than chip 701). In some embodiments, shield 710 may be pyramidal in shape; in other embodiments, shield 710 may be conical in shape. Furthermore, while shield 710 is illustrated as a single structure that is in close proximity to chip 701, in alternative embodiments shield 710 may be in physical contact with chip 701 and/or shield 710 may be formed directly on chip 701. For example, shield 710 may be formed by a lithographic process using a stack of metal layers to form a pyramidal shape, where each metal layer is shorter in length than the one beneath it and longer than the one above it.

Certain aspects of the present systems and methods may be realized at room temperature, and certain aspects may be realized at a superconducting temperature. Thus, throughout this specification and the appended claims, the term "superconducting" when used to describe a physical structure such as a "superconducting plane" is used to indicate a material that is capable of behaving as a superconductor at an appropriate temperature. A superconducting material may not necessarily be acting as a superconductor at all times in all embodiments of the present systems and methods.

The above description of illustrated embodiments, including what is described in the Abstract, is not intended to be exhaustive or to limit the embodiments to the precise forms disclosed. Although specific embodiments of and examples are described herein for illustrative purposes, various equivalent modifications can be made without departing from the spirit and scope of the disclosure, as will be recognized by those skilled in the relevant art. The teachings provided herein of the various embodiments can be applied to other systems, methods and apparatus, not necessarily the exemplary systems, methods and apparatus generally described above.

The various embodiments described above can be combined to provide further embodiments. All of the U.S. patents, U.S. patent application publications, U.S. patent applications, foreign patents, foreign patent applications and non-patent publications referred to in this specification and/or listed in the Application Data Sheet, including but not limited to U.S. patent application Ser. No. 13/050,742, filed Mar. 17, 2011, and entitled "Systems and Methods For Magnetic Shielding," U.S. Provisional Patent Application Ser. No. 61/316,744, filed Mar. 23, 2010, and entitled "Systems and Methods For Magnetic Shielding," PCT Patent Publication 2009-099972, PCT Patent Application Serial No. PCT/US2009/060026, now published as PCT Patent Publication 2010/042735, and U.S. Pat. No. 7,687,938 are incorporated herein by reference, in their entirety. Aspects of the embodiments can be modified, if necessary, to employ systems, circuits and concepts of the various patents, applications and publications to provide yet further embodiments.

These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A superconducting chip comprising:
   a plurality of superconducting devices;
   a superconducting plane positioned above the plurality of superconducting devices;
   a first current lead electrically coupled to the superconducting plane;
   a second current lead electrically coupled to the superconducting plane; and
   a fluxon barrier carried on the superconducting plane, wherein the fluxon barrier is positioned adjacent to an edge of the superconducting plane and extends substantially parallel thereto, and wherein the fluxon barrier comprises at least a first strip of superconducting material.

2. The superconducting chip of claim 1 wherein the fluxon barrier comprises at least a second strip of superconducting material that is stacked on top of the first strip of superconducting material.

3. The superconducting chip of claim 1 wherein the superconducting plane is a superconducting ground plane coupled to a ground.

4. The superconducting chip of claim 1 wherein the second current lead is spaced from the first current lead.

5. The superconducting chip of claim 4 wherein a current that exceeds a critical current of the superconducting plane is supplied via the first and the second current leads.

6. The superconducting chip of claim 5 wherein in response to the supply of the current that exceeds the critical current of the superconducting plane, a Lorentz force expels fluxons in a first direction, the first direction toward a first side of an imaginary line that extends between the first and the second current leads.

7. The superconducting chip of claim 6, further comprising:
   a fluxon barrier carried on the superconducting plane, the fluxon barrier positioned on a second side of the imaginary line that extends between the first and the second current leads, the second side opposed across the imaginary line from the first side of the imaginary line.

8. The superconducting chip of claim 7 wherein the fluxon barrier extends substantially parallel to the imaginary line that extends between the first and the second current leads.

9. The superconducting chip of claim 7 wherein the fluxon barrier comprises a strip of a material that becomes superconductive at a first critical temperature.

10. The superconducting chip of claim 9 wherein the first critical temperature of the strip of a material is higher than a critical temperature of at which the superconducting plane becomes superconductive.

11. The superconducting chip of claim 7 wherein the fluxon barrier comprises a stack of a plurality of strips of a material that superconducts at a critical temperature.

12. The superconducting chip of claim 1 wherein the superconducting plane is at or below a critical temperature at which the superconducting devices superconduct.

13. The superconducting chip of claim 12 wherein, while the superconducting plane is at or below the critical temperature, a current that exceeds a critical current of the superconducting plane is supplied via the first and the second current leads.

14. The superconducting chip of claim 12 wherein, while the superconducting plane approaches and reaches the critical temperature, a current that exceeds a critical current of the superconducting plane is supplied via the first and the second current leads.

15. The superconducting chip of claim 1 wherein a critical temperature at which the superconducting plane begins to superconduct is higher than a critical temperature at which the superconducting devices begin to superconductive.

16. The superconducting chip of claim 1 wherein the first and the second current leads are located at diagonally opposite corners of the superconducting plane.

17. The superconducting chip of claim 1 wherein the superconducting plane is in addition to an existing superconductive plane.

18. The superconducting chip of claim 1 wherein the superconducting devices include a plurality of qubits.

* * * * *